(12) United States Patent
Dasgupta et al.

(10) Patent No.: US 9,660,064 B2
(45) Date of Patent: May 23, 2017

(54) LOW SHEET RESISTANCE GAN CHANNEL ON SI SUBSTRATES USING INALN AND ALGAN BI-LAYER CAPPING STACK

(71) Applicant: INTEL CORPORATION, Santa Clara, CA (US)

(72) Inventors: Sansaptak Dasgupta, Hillsboro, OR (US); Han Wui Then, Portland, OR (US); Marko Radosavljevic, Beaverton, OR (US); Sanaz K. Gardner, Portland, OR (US); Seung Hoon Sung, Beaverton, OR (US); Benjamin Chu-Kung, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/141,304

(22) Filed: Dec. 26, 2013

(65) Prior Publication Data

US 2015/0187924 A1 Jul. 2, 2015

(51) Int. Cl.
*H01L 29/15* (2006.01)
*H01L 31/0256* (2006.01)
(Continued)

(52) U.S. Cl.
CPC .... *H01L 29/7783* (2013.01); *H01L 21/30617* (2013.01); *H01L 29/155* (2013.01);
(Continued)

(58) Field of Classification Search
CPC ........... H01L 21/02458; H01L 21/0254; H01L 33/007; H01L 29/2003; H01L 29/7787;
(Continued)

(56) References Cited

U.S. PATENT DOCUMENTS

2003/0222683 A1* 12/2003 Yu et al. ......................... 327/108
2004/0061129 A1* 4/2004 Saxler et al. .................. 257/194
(Continued)

FOREIGN PATENT DOCUMENTS

JP 2011-142200 7/2011

OTHER PUBLICATIONS

Intel Corporation, International search report and written opinion mailed Mar. 10, 2015 for PCT/US2014/065499.
(Continued)

*Primary Examiner* — Lex Malsawma
*Assistant Examiner* — Nduka Ojeh
(74) *Attorney, Agent, or Firm* — Blakely, Sokoloff, Taylor & Zafman LLP

(57) ABSTRACT

Transistors or transistor layers include an InAlN and AlGaN bi-layer capping stack on a 2DEG GaN channel, such as for GaN MOS structures on Si substrates. The GaN channel may be formed in a GaN buffer layer or stack, to compensate for the high crystal structure lattice size and coefficient of thermal expansion mismatch between GaN and Si. The bi-layer capping stack an upper InAlN layer on a lower AlGaN layer to induce charge polarization in the channel, compensate for poor composition uniformity (e.g., of Al), and compensate for rough surface morphology of the bottom surface of the InAlN material. It may lead to a sheet resistance between 250 and 350 ohms/sqr. It may also reduce bowing of the GaN on Si wafers during growth of the layer of InAlN material, and provide a AlGaN setback layer for etching the InAlN layer in the gate region.

26 Claims, 7 Drawing Sheets

(51) Int. Cl.
    *H01L 21/338*   (2006.01)
    *H01L 29/778*   (2006.01)
    *H01L 21/306*   (2006.01)
    *H01L 29/66*    (2006.01)
    *H01L 29/20*    (2006.01)

(52) U.S. Cl.
    CPC .... *H01L 29/2003* (2013.01); *H01L 29/66462* (2013.01); *H01L 29/7786* (2013.01)

(58) Field of Classification Search
    CPC ............. H01L 29/66462; H01L 31/105; H01L 21/02381; H01L 21/36; H01L 29/0684
    USPC .. 257/76, 183, 189–194, 613–615, E51.043, 257/E33.023, E33.049; 438/172, 930, 438/FOR. 256, FOR. 264, FOR. 267
    See application file for complete search history.

(56) References Cited

U.S. PATENT DOCUMENTS

| | | |
|---|---|---|
| 2005/0253151 A1* | 11/2005 | Sakai et al. ................ 257/79 |
| 2006/0006435 A1 | 1/2006 | Saxler et al. |
| 2006/0057790 A1* | 3/2006 | Clarke et al. ................ 438/172 |
| 2006/0197109 A1 | 9/2006 | Saxler |
| 2008/0056320 A1* | 3/2008 | Takeuchi ................ 372/45.01 |
| 2009/0072240 A1* | 3/2009 | Suh et al. ................ 257/76 |
| 2010/0265976 A1* | 10/2010 | Bousquet .......... H01L 21/02389 372/44.01 |
| 2010/0270591 A1 | 10/2010 | Ahn |
| 2010/0317132 A1* | 12/2010 | Rogers ................ H01L 25/0753 438/27 |
| 2010/0330754 A1* | 12/2010 | Hebert ................ 438/172 |
| 2012/0098598 A1* | 4/2012 | Uno et al. ................ 330/277 |
| 2012/0153356 A1* | 6/2012 | Saunier ................ 257/194 |
| 2012/0280244 A1* | 11/2012 | Hwang et al. ................ 257/76 |
| 2013/0043485 A1* | 2/2013 | Ueno ................ 257/76 |
| 2013/0257539 A1* | 10/2013 | Kotani ................ 330/277 |
| 2014/0158976 A1 | 6/2014 | Dasgupta et al. |

OTHER PUBLICATIONS

"International Preliminary Report on Patentability and Written Opinion of the International Searching Authority", mailed Jul. 7, 2016, International Appln. No. PCT/US2014/065499.

Taiwan Search Report and Office Action dated Jan. 14, 2016 for Taiwan Application No. 103140656.

* cited by examiner

LOW SHEET RESISTANCE GAN CHANNEL ON SI SUBSTRATES USING INALN AND ALGAN BI-LAYER CAPPING STACK

An embodiment of the invention is related to Gallium Nitride (GaN) circuit devices and the manufacture and structure of GaN channel based circuit devices. Other embodiments are also described.

BACKGROUND

Increased performance in and yield of circuit devices on a substrate (e.g., integrated circuit (IC) transistors, resistors, capacitors, etc. on a semiconductor (e.g., silicon) substrate) is typically a major factor considered during design, manufacture, and operation of those devices, or a system on a chip including such devices. For instance, Gallium Nitride (GaN) circuit devices having a GaN channel may be part of a voltage regulator, a power management integrated circuit (IC), a radio frequency (RF) power amplifier, for a system on a chip (SoC) architecture. Design and manufacture (e.g., forming) of such devices may include transistors or transistor layers (e.g., layers of material that are included in or part of a transistor) of a GaN channel metal oxide semiconductor (MOS) devices. Such devices may be a GaN MOS-high electron mobility transistor (HEMT).

Such GaN channel devices may include a gate, a gate dielectric, a source region (e.g., junction region), and a drain region (e.g., junction region). The conductive channel of the device resides beneath the gate dielectric. Specifically, current runs along/within the channel. For a "fin" device or channel, the conductive channel of such configurations essentially resides along the three different outer, planar regions of the fin. There are a number of non-trivial issues associated with fabricating such GaN channel devices or transistors.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
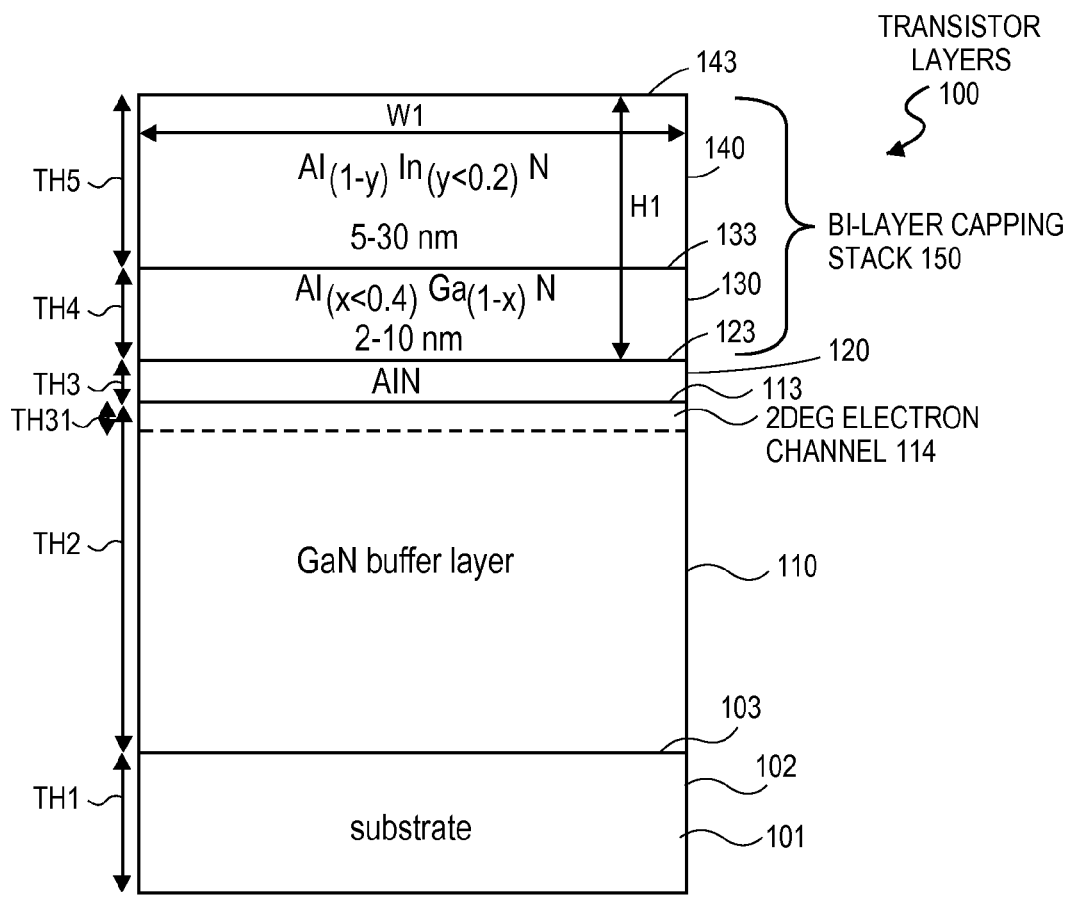
FIG. 1 is a schematic cross section view of a portion of a semiconductor substrate base after forming Gallium Nitride (GaN) channel based transistor layers including an InAlN and AlGaN bi-layer capping stack on a GaN layer.

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

There are a number of non-trivial issues associated with fabricating Gallium Nitride (GaN) channel devices or transistors. For example, for GaN layers grown on blanket Silicon (Si) substrates, two main challenges to be overcome are lattice mismatch and thermal mismatch between the GaN material and the Si material. There is a high crystal structure lattice size mismatch between GaN and Si (17% for GaN on Si (111) and 41% for GaN on Si (100)); and a large mismatch in coefficient of thermal expansion between GaN and Si (around 115% for GaN and Si). Due to this, very complicated buffer engineering can be used to maintain low enough defect density (~1E9/cm2) and also to prevent surface cracks due to the thermal mismatch. A typical GaN channel stack structure (e.g., GaN buffer layer) may include a complex layer stack design for obtaining GaN layers with low enough defect density and zero surface cracks on Si (100) (e.g., See FIG. 2).

According to some embodiments, a 2-dimensional electron gas (2DEG) channel can be created in GaN layer of GaN transistors by capping the GaN layer with a single capping layer. The difference in spontaneous polarization and piezoelectric polarization due to strain in the capping layer, may result in the formation of a 2DEG channel in the GaN layer with high electronic charge and high mobility. However, certain capping layer material grown on top of this buffer stack may suffer from poor composition uniformity (e.g., of Al and In of an InAlN layer) and rough surface morphology resulting in the low channel mobility due to interface scattering and alloy scattering. Also, AlInN alloys are grown at relatively low temperatures by MOCVD (metalorganic chemical vapor deposition) at around ~700-800 Celsius (C) while GaN is grown at ~1050 C by chemical vapor deposition (CVD). The temperature drop to grow an AlInN capping layer may—results also in some bowing of the GaN/Si wafers during growth further degrading the uniformity of the AlInN layer and hence resulting in low mobility.

Some embodiments described herein provide an InAlN and AlGaN bi-layer capping stack on a 2DEG GaN channel, such as for GaN MOS-high electron mobility transistor (HEMT) structures on Si substrates. The 2DEG GaN channel may be formed in a GaN buffer layer or stack, to reduce or compensate for the high crystal structure lattice size mismatch and large mismatch in coefficient of thermal expansion between GaN and Si. The bi-layer capping stack may use two polarization charge inducing layers (e.g., InAlN and AlGaN) to reduce or compensate for poor composition uniformity (e.g., of Al and In) and rough surface morphology of the bottom surface of the cap layer of InAlN material. Using two layers in the bi-layer capping stack may also reduce or compensate for bowing of the GaN/Si wafers during growth of the cap the cap layer of InAlN material.

In addition, two key requirements may be identified to obtain high performance GaN transistors which can be used as "power devices" such as a voltage regulator (VR), a power management (PM) integrated circuit (IC), a radio frequency (RF) power amplifier for a system on a chip (SoC). First, it may be desired to have low sheet resistance (Rsh) in the GaN channel (typically less than or equal to 250 ohms/sqr, a very aggressive number). Second, it may be desired to have a controlled way to create E-mode operation for the GaN transistors.

According to some embodiments, a transistor or transistor layers having the InAlN and AlGaN bi-layer capping stack on a GaN channel provide low sheet resistance (Rsh) in the GaN channel and an E-mode operation for GaN transistors (e.g., see the structure or transistor layers of FIG. 1). Such transistor layers may be layers of material that are included in or part of a transistor. Such a transistor may be a GaN MOS-high electron mobility transistor (HEMT). The transistor may be a flat, thin, or tri-gate transistor; and top surface of the substrate may be single crystal silicon having a (100), (111), or (110) Miller Index with substrate miscuts ranging from 2-10° along certain preferred directions. The transistor may be part of a voltage regulator, a power management integrated circuit (IC), a radio frequency (RF) power amplifier, or a system on a chip (SoC). Some embodiments include, the GaN channel grown out of trenches in the Silicon substrate. Some embodiments include, a GaN channel based fin transistor having a GaN fin channel grown on a Silicon fin and an InAlN and AlGaN bi-layer capping stack on the GaN fin channel.

Using the bi-layer capping stack may provide a higher channel mobility, higher charge density and lower sheet resistance for a GaN channel having a 2DEG channel or channel portions. For example, a bi-layer capping stack for such transistors may include two 2DEG channel portions adjacent a gate channel portion (that is not 2DEG) to provide very low resistance between outer junction regions so that power is not lost or required for such transistors to deliver power from a battery to other circuitry. The lower the sheet resistance in this region, the higher is the efficiency of the transistor used for power delivery etc. Also, for PMIC and voltage regulator design for SoC using GaN transistors, a channel with sheet resistance (Rsh) of 250 ohms/sqr and lower can be a beneficial requirement. Also for SoC the GaN layers can be beneficially co-integrated with Si CMOS on the same wafer, hence a device or process of creating the GaN channel with the required resistance is unique.

For example, two main components that may lead to the low Rsh values for the 2DEG channel are: (1) High Electron density which for this combination >2.5E13/cm2; and (2) high channel mobility ~900-1400 cm2/V−s. According to some embodiments, an upper AlInN layer in the bi-layer stack may generate the high electron density whereas a lower AlGaN layer may help in keeping the channel mobility high. Embodiments having just an AlGaN cap alone, may not lead to high electron density like density >2.5E13/cm2. Also, embodiments having only a InAlN cap on GaN layers grown on Si substrates may result in low channel mobility. However, a bi-layer stack of an upper AlInN layer (specifically $Al_{0.83}I_{0.17}N$) and a lower AlGaN layer (where Al<0.4) may provide the low Rsh required for VR and PMIC GaN transistors, such as for SoC.

In some cases, the bi-layer capping stack is formed on or over a top surface of the GaN layer having the 2DEG channel, wherein the bi-layer capping stack induces or causes low a sheet resistance in the GaN channel (e.g., in the 2DEG channel), such as sheet resistance of <250 ohms/sqr; or between 200 and 350 ohms/sqr. In some cases, the AlGaN layer of the bi-layer capping stack causes electrons in a channel of the GaN material to be subject to less interface roughness scattering and less alloy scattering, and thus provide a higher mobility than without the AlGaN layer.

FIG. 1 is a schematic cross section view of a portion of a semiconductor substrate base 101 after forming Gallium Nitride (GaN) channel based transistor layers including an InAlN and AlGaN bi-layer capping stack 150 on a GaN layer 110. FIG. 1 shows transistor layers 100 including substrate 101 of material 102 having top surface 103. GaN buffer layer 110 is formed on top surface 103. GaN layer 110 has 2-dimensional electron gas (2DEG) electron channel 114. Layer 110 has top surface 113. AlN layer 120 has top surface 123. Lower layer 130 is formed on surface 123. Lower layer 130 has top surface 133. Upper layer 140 is formed on surface 133. Upper layer 140 has top surface 143. Substrate 101 has thickness TH1; layer 110 has thickness TH2; layer 120 has thickness TH3; layer 130 has thickness TH4; and layer 140 has thickness TH5. Channel 114 has a thickness of TH31.

Transistor layers 100 may represent or be layers that are included in a functional or functioning transistor. In some cases, transistor layers 100 may represent or be layers that are included in a structure that will be further processed to form a functional or functioning transistor (e.g., see FIGS. 3 and 6-8). In some cases, layers 100 may be part of or used to form a flat, thin, tri-gate, or a GaN MOS-high electron mobility transistor (HEMT). The transistor may be part of a voltage regulator, a power management integrated circuit (IC), a radio frequency (RF) power amplifier, or a system on a chip (SoC).

Substrate 101 may be single crystal silicon substrate having a (100), (111), or (110) Miller Index. In some cases, material 102 is a silicon material having a crystalline structure of (100), (111), or (110) along surface 103. In some cases, TH1 may be in a range of between 500 to 1200 microns. The Silicon substrate (e.g., Si (100)) may also have a miscut ranging from 2-10° along certain preferred directions (e.g., (110)).

Figure 2:
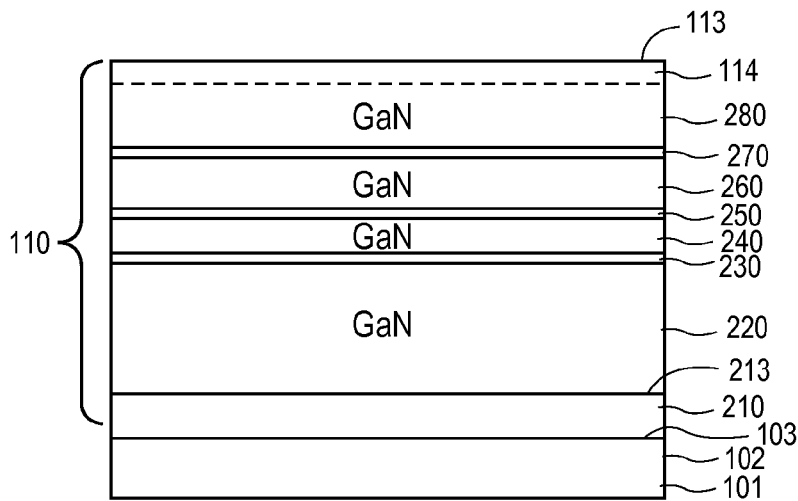
FIG. 2 shows details of one example of the GaN buffer layer of FIG. 1.

Buffer or layer 110 may be a GaN buffer layer or a GaN stack (e.g., having a 2DEG channel formed in the GaN buffer layer or stack), to reduce or compensate for the high crystal structure lattice size mismatch and large mismatch in coefficient of thermal expansion between GaN and Si (e.g., see FIG. 2). In some cases, TH2 may be in a range of 1 micron and above.

Bi-layer capping stack (e.g., structure) 150 may be formed on (e.g., over or touching) top surface 113 of GaN layer 110. Stack 150 may include, be formed by, or be formed by a process including forming lower (e.g., first or bottom) capping layer 130, which comprises or is an AlGaN material on (e.g., over) top surface 113 of GaN layer 110. In some cases, layer 130 is formed on (e.g., over or touching) top surface 123 of GaN layer 120. In some cases, capping layer 130 comprises or is an AlGaN material formed on (e.g., over or touching) top surface 123 of AlN layer 120 formed on surface 113.

Stack 150 may also include, be formed by, or be formed by a process including forming upper (e.g., second or top) capping layer 140, which comprises or is an AlInN material on (e.g., over or touching) top surface 133 of lower layer 130 (e.g., of the AlGaN material). Stack 150 has width W1, height H1 and length L1 (not shown but going into the page).

In some cases, W1 is in a range of between 50 nm and 10 um. In some cases, W1 is in a range of between 50 nm and 500 nm. In some cases, W1 is in a range of between 50 nm and 100 nm. In some cases, L1 is in a range that depends on the transistor width, on applications and on circuit layout. In some cases, L1 is in a range from 5 microns to 20 mm.

According to embodiments, stack 150 is layers 130 and 140. According to other embodiments, stack 150 is layers 120, 130 and 140. According to embodiments, stack 150 includes or consists essentially of is layers 130 and 140. According to embodiments, stack 150 includes or consists essentially of is layers 120, 130 and 140.

In some cases, layer 130 layer is $Al_xGa_{(1-x)}N$, where X is less than 0.4. In some cases X is equal to 0.3. In some cases X is between 0.05 and 0.4. In some cases, TH4 (the AlGaN layer thickness) is of between 2 and 10 nm. In some cases it is between 2-10 nm. In some cases it is between 8-10 nm. In some cases it is 2 nm. In some cases it is 5 nm. In some cases, surface 133 (e.g., a top surface of the AlGaN material) forms a uniform and high crystal quality AlGaN material surface upon which the AlInN material is formed (e.g., epitaxially grown from). The thickness of the AlGaN layer may depend on the composition of the AlGaN layer being grown. For higher Al containing AlGaN compounds the thickness that can be grown pseudomorphically on the GaN buffer stack is reduced as compared to lower Al containing AlGaN compounds. In some cases, it is important that the AlGaN layer thickness is kept below this "critical thickness" (e.g., 10 nm) as generation of misfit dislocations due to lattice mismatch between 130 and GaN buffer stack will reduce the channel mobility.

In some cases, layer 140 layer is $Al_yIn_{(1-y)}N$, where Y is greater than 0.8. In some cases Y is equal to 0.83. In some cases, TH5 (the AlInN layer thickness) is of between 5 and 35 nm. In some cases, TH5 is of between 5 and 30 nm. In some cases, layer 140 induces a channel in GaN with electron mobility between 900 and 1400 $cm^2/V-s$. In some cases, the mobility is 960 $cm^2/V-s$. In some embodiments, X is less than 0.4 and Y is greater than 0.2.

According to embodiments, a large band gap between material 140 and material 110 causes a layer of electrons to exist below surface 113 of material 110. In some cases, layer 130 should also consist of a material with band gap greater than that of material 110. This layer of electrons may cause or be described as 2DEG electron channel 114. In some cases, channel 114 forms at an interface below layer surface 113, such as by including electrons that reside in thickness TH31 below surface 113, and form a channel there that requires no biasing for conduction. The amount of charge carriers and conduction may depend on or be proportional to the thickness of material 140 and concentration of aluminum in material 140. In some cases, TH31 may be in a range of between 1 and 3 nm.

Channel 114 may include an electron channel in the which is confined in one dimension due to a quantum well formation, such as a two-dimensional sheet of electron charge that has higher mobility and requires less or zero gate voltage for conduction than a MOS channel. In some cases channel 114 does not require doping due to the crystal structure of layer 140 providing an electron density within channel 114 due to polarization effects. Thus it may not be necessary to form a gate or metal layer over layer 130 or 140 to create carrier conduction within channel 114, which means that the transistor would be "on" without any gate voltage. However, it may be necessary to apply a bias voltage on gate to induce charge if layer 140 is removed from stack 150.

According to some embodiments, the InAlN and AlGaN bi-layer capping stack on a GaN channel provides low sheet resistance (Rsh) in the GaN channel. In some cases, layer 120 is a thin layer of AlN that helps cause electrons in a channel of the GaN material to be subject to less interface roughness scattering and less alloy scattering, and thus provide a higher mobility than without the AlN layer. In some cases, layer 120 may be thickness TH3 in a range of between 0.6 and 1.5 nanometers. In some cases, layer 120 has a thickness TH3 of 1 nm. In some cases, TH3 is 1.2 nanometers or less than 1.2 nanometers.

In some cases, layer 130 (or layer 130 and layer 120) causes electrons in channel 114 (e.g., 2DEG of the GaN material) to be subject to less interface roughness scattering and less alloy scattering, and thus provide a higher mobility in channel 114 than without the AlGaN layer (e.g., than with only layer 140, without layer 130). Layer 130 may have thickness TH4 that is thin enough so that there are not many carriers or much general conduction in layer 130 and also does not create misfit dislocations due to the lattice mismatch between 130 and 110.

In some cases, the non-uniformity of aluminum and indium in layer 140 would lead to more scattering of electrons and less mobility without the use of layer 130 which has a more uniform distribution of aluminum along the length and width of layer 130 (e.g. perpendicular to thickness TH4). In some cases, since layer 140 may be non-uniform or rough with respect to concentrations of aluminum and indium within layer 140, layer 130 may provide a smoother and higher quality material that provides increased mobility in channel 114 since the uniformity of aluminum in layer 130 may be more homogenous and continuous (e.g. smooth). The more homogenous or smooth consistency of reduces the alloy scattering and interface roughness scattering of electrons in channel 114. Layer 120 may reduce alloyed scattering in channel 114, as compared to having layer 130 touching or on surface 113 or channel 114.

In some cases, bi-layer capping stack 150 causes or induces a sheet resistance of less than or equal to 250 ohms per SQR in channel 114 (e.g., across W1, between left and right ends of that channel). In some cases, bi-layer capping stack 150 causes or induces a sheet resistance of between 200 and 300 ohms per SQR in channel 114. In some cases, this sheet resistance of R ohms per SQR is defined for or across the width W1 of stack 150 and L1.

Sheet resistance may be the resistance is given by: R=Rho*W1/A where Rho is the resistivity of a sample of material (e.g., layers 130 and 140), and W1 and A are its width and cross-sectional area (e.g., H1×L1), respectively. If L1 is the length of the sample and H1 is its thickness or height (i.e., A=L1×H1), then the resistance can be written: R=(Rho/H1) (W1/L1)=Rs (W1/L1) where Rs=Rho/H1 is the sheet resistance of a layer of this material. Strictly speaking, the unit for sheet resistance may be the ohm (since W1/L1 is unitless). To avoid confusion between R and Rs, however, sheet resistance may be specified in unit of "ohms per square." The W1/L1 ratio can be thought of as the number of unit squares (of any size) of material in the resistor (e.g., layers 130 and 140).

According to some embodiments, the InAlN and AlGaN bi-layer capping stack on a GaN channel reduces or compensates for bowing of the GaN/Si wafers during growth of the cap material. It is noted that AlInN alloys are typically grown at relatively low temperatures by MOCVD (metalorganic chemical vapor deposition) at around ~700-800 C while GaN is grown at ~1050 C by CVD. Without layer 130, the temperature drop to grow the AlInN layer 140 may result in some bowing of the GaN/Si wafers during growth further degrading the composition uniformity of the AlInN layers and hence resulting in low mobility.

According to some embodiments, the InAlN and AlGaN bi-layer capping stack on a GaN channel provides a "setback" material surface for etching an opening for the gate. For example, in some cases, layer 130 (e.g., surface 133; a top surface of the AlGaN material) forms a "setback" material surface. As a "setback" layer, layer 130 (e.g., surface 133) may be a layer that can be used as an etch stop, so that other layers (e.g., material of layer 140) may be selectively etched with respect to material of layer 130. For example, in some cases, stack 150 includes layers 130 and 140 (and optionally layer 120) at or under the junction regions and in portions 340 and 342; while only layer 130 (and optionally layer 120) of stack 150 (e.g. not layer 140) exists under the gate (e.g., see FIGS. 3 and 6-8). In these cases, layer 140 may be selectively etched to form a trench for a gate.

Thus, including the AlGaN layer 130 (which is grown at 1000-1050 C) acts as a nice setback layer, which is both uniform and of high crystal quality and thus preserves the high mobility of the electron channel in the GaN layer. These are some ways the layers of the bi-layer stack may act in unison to result in high charge density and high mobility simultaneously for GaN channels grown on Si substrates.

According to some embodiments, the InAlN and AlGaN bi-layer capping stack on a GaN channel also provides an E-mode operation for GaN transistors. For example, for a transistor to be used as part of a voltage regulator, power management IC or RF power amplifier, one desired mode of operation is as an E-mode transistor which means a transistor with Vt>0 V. To make an E-mode transistor in GaN, typically the capping layer is etched off under the gate (e.g., forming trench 305). For single capping structures (e.g., without both layer 130 and 140 prior to etching to form trench 305), the etch is typically done by a dry etch and is timed, there are no etch-stops. This of course leads to yield issues and can result in low channel mobility due to over etch or etch damages. The bi-layer stack has a great advantage in that aspect too, AlInN can be selectively wet etched under hot KOH or NH40H solutions, while the AlGaN layer is not. Since all or at least 90 percent of the electronic charge is due to the AlInN layer, complete removal of it results in obtaining E-mode operation. Thus the process can be very well controlled and also the channel mobility is not compromised due to over etch or dry etch damages.

Using a GaN buffer or stack may reduce or compensate for the high crystal structure lattice size mismatch and large mismatch in coefficient of thermal expansion between GaN and Si. In some cases, layer 110 has or is a GaN stack of multiple GaN layers separated by AlN layers. Each adjacent pair of adjacent (e.g., vertically adjacent or stacked) GaN layers may be separated by a thinner AlN layer. There may also be an AlN layer between the bottom GaN layer and the substrate. In some cases, layer 110, or the GaN buffer layer or stack (e.g., see FIG. 2) has a defect density less than or equal to 1E9/cm2 (e.g., within TH31 or channel 114).

FIG. 2 shows details of an example of the GaN buffer layer 110 of FIG. 1. FIG. 2 shows layer 110 having AlN layers 230, 250 and 270 formed between GaN layers 220, 240, 260 and 280. AlN layer 210 is formed between top surface 103 and a bottom surface of layer 220 (e.g., the bottom GaN layer).

Layer 110 may include layer 210 (and other AlN layers) due to the large lattice mismatch between silicon material 102 and GaN material within layer 110. For example, layer 210 may reduce, prevent, or provide a buffer between surface 103 and material 102 and layer 220. Layer 210 may also trap silicon defects and reduce lattice mismatch defects from reaching layer 220. Layer 210 may also reduce chemical reaction between material 102 and the GaN material of layer 220.

In some cases, layer 210 may be a nucleation layer grown on substrate 100, for example, to help begin growth on layer 101 of one or more layers of semiconductor material (e.g., one or more III-N semiconductor materials such as GaN, AlN, AlGaN, AlInN, etc., which may form layer 101). In some cases in which substrate 101 comprises Si(100), for example, nucleation layer 210 may comprise a semiconductor material such as, but not limited to, aluminum nitride (AlN), AlGaN, an alloy of any of the aforementioned, and/or a combination of any of the aforementioned. In some embodiments, nucleation layer 210 may have a thickness in the range of about a monolayer to about 300 nm or greater (e.g., about 100-200 nm or greater, or any other sub-range within the range of about 1-300 nm or greater).

In some cases, layer 220 includes a lower 3 dimensional crystal structure that is grown as islands on surface 213 of layer 210; and upper 2 dimensional crystal structure. Such islands may be between 50 and 250 nm wide or in diameter. Such islands may be approximately 100 nanometers in diameter. Such islands may be approximately 100-250 nanometers in height or thickness. For instance, in some example embodiments, three-dimensional islands may have a thickness in the range of about 1-250 nm or greater (e.g., about 50-100 nm or greater; about 100-150 nm or greater; about 150-200 nm or greater; about 200-250 nm or greater; or any other sub-range within the range of about 1-250 nm or greater).

In some cases, such islands may be grown or located sufficiently proximate one another on surface 213 so as to generally overlap or otherwise merge with another while remaining substantially discrete. This may avoid forming a continuous layer across the underlying topology of nucleation layer 210.

Figure 6:
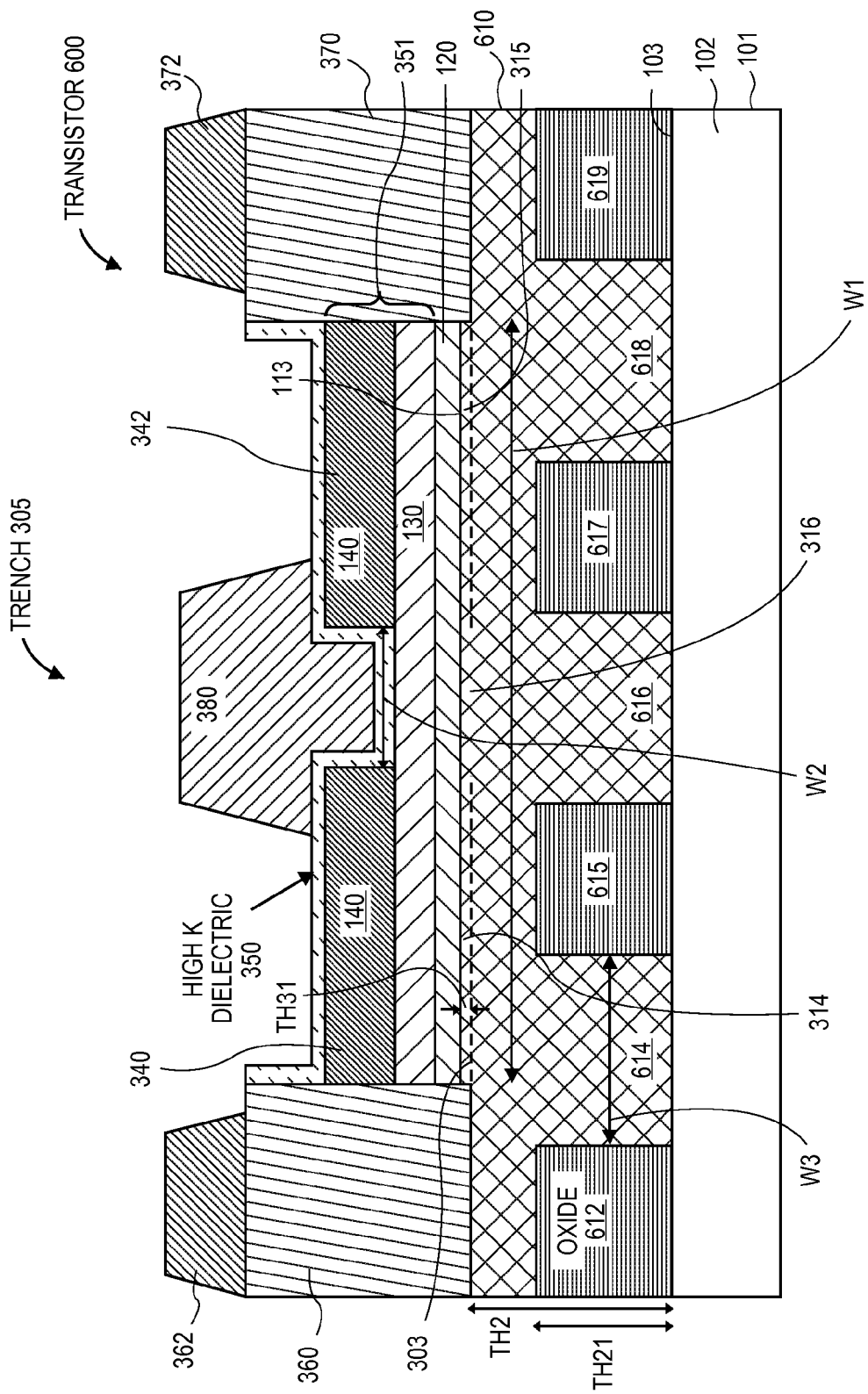
FIG. 6 is a schematic cross section view of a portion of a semiconductor substrate base after forming a Gallium Nitride (GaN) channel based transistor having a GaN layer grown out of trenches or gaps in the Silicon substrate; and an InAlN and AlGaN bi-layer capping stack on the GaN layer.

In some embodiments, such islands can be formed by growing the islands in trenches (e.g., represented by features 614, 616 and 618 FIG. 6) between insulator patches (e.g., represented by features 612, 615, 617 and 619 FIG. 6) formed on surface 213 of layer 210 (e.g., see FIG. 6). In some embodiments, such islands can be formed by being forced to grow in a three-dimensional mode by in-situ patterning. Such islands may be grown on or from surface 213 between a plurality of small features (e.g., in-situ islands, patches, etc.) of insulator which may help to ensure that subsequent formation of the islands of are three-dimensional (e.g., consists of a plurality of island-like semiconductor structures). In some example instances, these small, patchy features of insulator layer (e.g., represented by features 612, 615, 617 and 619 FIG. 6) may have a thickness (e.g., a height/depth) in the range of about 10 nm or less (e.g., about 5-10 nm or less; about 1-5 nm or less; a monolayer; etc.). By virtue of providing such an optional insulator features, the island-like structures may be caused to grow or otherwise form between the features thereof.

In some embodiments, such islands can be formed by growing the islands as nanowires in gaps (e.g., represented by features 614, 616 and 618 FIG. 6) between insulator (e.g., represented by features 612, 615, 617 and 619 FIG. 6) formed on surface 213 of layer 210. In some embodiments, such islands can be formed by being forced to grow in a three-dimensional mode by ex-situ patterning. In some cases, an insulator layer formed on surface 213 may be patterned with one or more gap features which may help to ensure that subsequent formation of semiconductor layer is three-dimensional (e.g., consists of a plurality of nanowires). In accordance with embodiments, the dimensions of a given gap feature (e.g., represented by features 614, 616 and 618 FIG. 6) may be customized as desired, and in some example instances may have a width in the range of about 1-250 nm or greater. In some instances, a given gap feature may have a height/depth in the range of about 1-250 nm or greater. By virtue of providing such an optional insulator layer, the nanowires may be caused to grow or otherwise form within gap features and to broaden/expand therefrom. In some cases, a given nanowire may have a width in the range of about 1-250 nm or greater. Also, in some embodiments, a given nanowire may have a height/depth in the range of about 1-250 nm or greater.

Such 3 dimensional crystal structure islands may reduce defects in the upper 2 dimensional crystal structure (e.g., layer 220). After forming such islands, an upper 2 dimensional crystal structure may be grown on the islands. The upper 2 dimensional crystal structure may be grown as blanket layer. The upper 2 dimensional crystal structure may have a thickness of between 50 nm and 5 micro meters. The upper 2 dimensional crystal structure may have a thickness of between 1.2 and 1.5 micro meters. The upper 2 dimensional crystal structure may have a thickness of 900 nm. One example of the upper 2 dimensional crystal structure may include or be layers 220-280 (e.g., excluding the islands).

Next, FIG. 2 shows an example layer 110 having AlN layers 230, 250 and 270; and GaN layers 240, 260 and 280 formed on layer 220 (e.g., formed on the upper 2 dimensional crystal structure). Layers 230, 250 and 270 may buffer or compensate for the large thermal mismatch between the GaN material of layer 110 and that of Si substrate 101. In some cases, during forming of layer 110, layer 110 is formed in a convex, cross sectional shape, so that when layer 110 reaches operating temperature, layer 110 forms a flat layer with reduced cracking due to the thermal mismatch between the GaN material of layer 110 and that of substrate 101. In some embodiments, substrate 103 has Miller Index (100).

In some embodiments, layer 210 has a thickness of between 50 and 350 nm; layer 220 has a thickness of between 90 and 1500 nm; layer 230 has a thickness of between 5-25 nm 16 and 18 nm; layer 240 has a thickness of between 100-400 nm 218 and 268 nm; layer 250 has a thickness of between 5-25 nm, layer 260 has a thickness of between 100-450 nm, layer 270 has a thickness of between 5-25 nm; and layer 280 has a thickness of between 400 and 900 nm thick. In some embodiments, layer 210 has a thickness of 247 nm; layer 220 has 3D GaN of approximately 100 nm and GaN of 900 nm. In this embodiment, layer 230 is approximately 16 nm; layer 240 is 243 nm; layer 250 is 9.4 nm; layer 260 is 383 nm; layer 270 is 5.6 nm; and layer 280 is 570 nm thick.

In some cases, layer 110 has or is a stack of multiple layers of one or more III-N semiconductor materials such as GaN, AlN, AlGaN, AlInN, etc. For instance the GaN layers of layer 110 described above may represent layers of AlGaN having a low concentration of Al, such as below 10 percent Al (e.g., sometimes below 5 percent); and the AlN layers of layer 110 described above may represent layers of AlGaN or AlInN having a low concentration of Ga or In, such as below 10 percent Ga or In (e.g., sometimes below 5 percent).

In some embodiments, a given semiconductor layer of layer 110 may have a thickness, for example, in the range of about 1-100 nm or greater (e.g., about 20 nm or less; about 50 nm or less; about 80 nm or less; or any other sub-range within the range of about 1-100 nm or greater). In some example cases in which a given semiconductor of layer 110 comprises AlGaN having a high concentration of Al (e.g., greater than about 95%), for instance, such semiconductor layer may have a thickness in the range of about 1-20 nm. In some example cases in which a given semiconductor of layer 110 comprises AlGaN having a low concentration of Al (e.g., less than or equal to about 5%), for instance, such semiconductor layer may have a thickness in the range of about 10-1000 nm.

Figure 3:
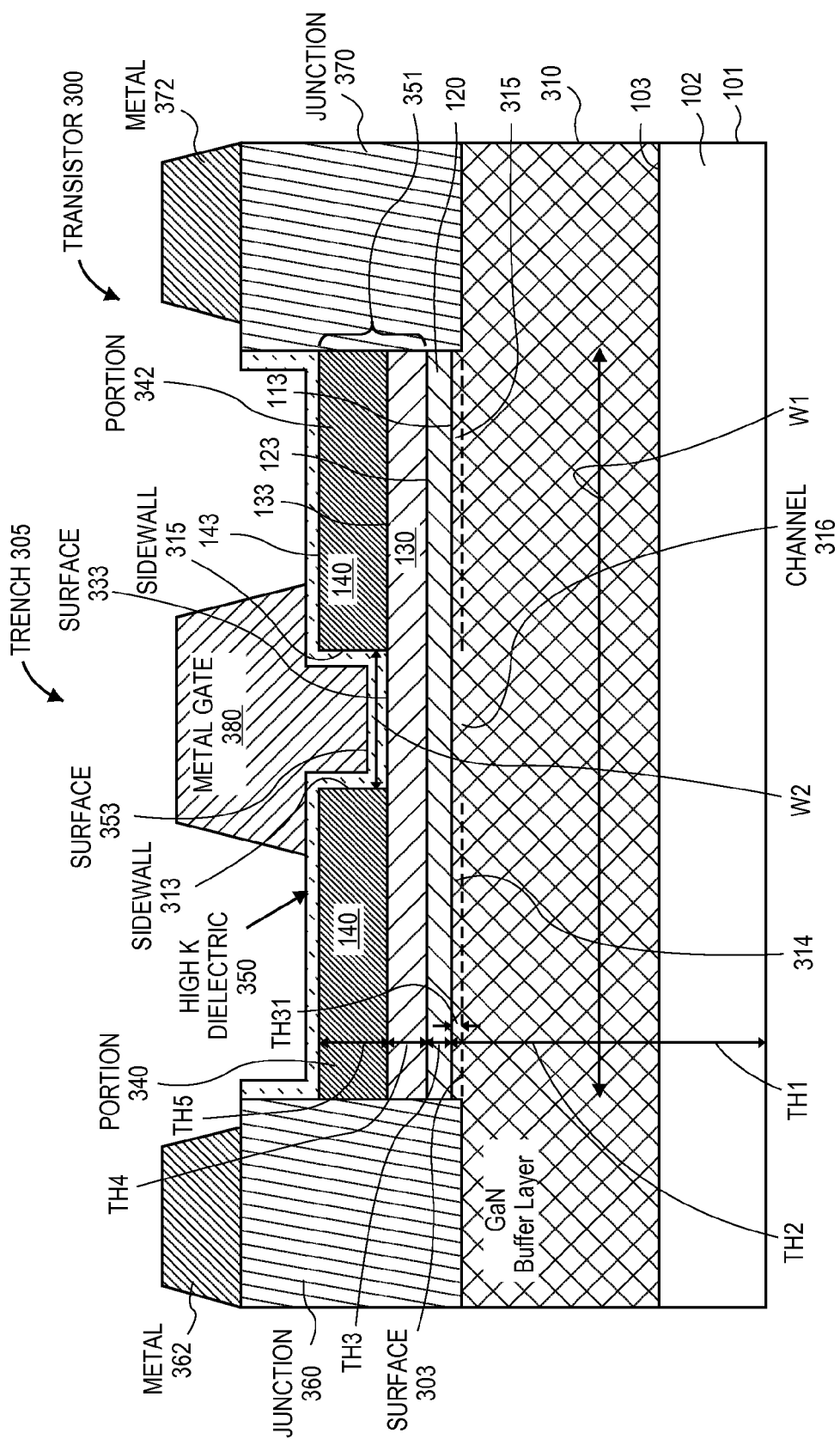
FIG. 3 shows the semiconductor substrate of FIG. 1 after forming a gate, and junction regions on or in the transistor layers.

FIG. 3 shows the semiconductor substrate of FIG. 1 (e.g., layers 100) after forming transistor 300 including gate 380, junction region (e.g., source) 360 and junction region (e.g., drain) 370 on or in the transistor layers. FIG. 3 shows a portion of a semiconductor substrate base 101 after forming a Gallium Nitride (GaN) channel based transistor 300 having a GaN layer 310 formed from layer 110; and an InAlN and AlGaN bi-layer capping stack (e.g., stack 351 with trench 305) on the GaN layer. For transistor 300, stack 351 may be equal to stack 150 including trench 305 etched or disposed through layer 140 and to layer 130. Consequently, transistor 300 includes layer 310 having 2DEG channels 314 and 315 adjacent to channel 316 below gate 380. Channel 316 excludes a 2DEG channel because layer 140 does not exist above channel 316.

FIG. 3 shows trench 305 etched in layer 140 to form separate portions 340 and 342 of layer 140. Trench 305 is etched to expose top surface 333 of layer 130 having width W2 (and length L2 going into the page but not shown) of surface 133 of layer 130. High-K dielectric layer 350 is formed, conformally, (1) over top surface 143 of portions 340 and 342; (2) on sidewalls 313 and 315 of portions 140 and 142 in trench 305; and (3) on exposed surface 333. Layer 350 has thickness TH6, which may be equal to between 1 and 15 nm.

FIG. 3 shows channel 314 and 315, such as channel 114, under portion 340 and 342, respectively, of stack 351. Layer 310 may be similar to layer 110 except that channel 114 does not exist at channel 316 due to the removal of layer 140 in trench 305; and channel 114 does exist as channels 314 and 315 respectively where layer 140 does exist adjacent to trench 305. Channel 316 is shown without or not including channel 114 (e.g. channel 314 or channel 315). Channel 316 may exclude a 2 DEG electron channel due to not having layer 140 above channel 316. Thus, it is necessary to bias channel 316 to create conduction or carrier movement between a portion 340 and portion 342. This may be described as requiring a threshold voltage greater than zero volts (e.g. operation is a E-mode transistor operation). In some cases, such E-mode is as known in the art. In some cases, layer 140 is selectively etched away within trench 305 to remove the 2DEG channel from channel 316 so that the threshold voltage is required to activate the channel or activate the transistor. In some cases, selectively etching layer 140 (e.g., the AlInN material) includes selectively etching the AlInN material using a wet etch including a KOH or a NH4OH solution to selectively etch the AlInN material but not etch (e.g., with the exception of etching) the AlGaN material. Layer 130 may be used as a setback layer for this etch.

In some cases, bi-layer capping stack 351 causes or induces a sheet resistance of less than or equal to 250 ohms per SQR in the combination of the 2DEG channels 314 and 315 (e.g., excluding channel 316). In some cases this resistance may be across W1, between left and right ends of the channel of the combination of channels 314 and 315 (excluding channel 316). In some cases, bi-layer capping stack 351 causes or induces a sheet resistance of between 200 and 300 ohms per SQR in the combination channel.

Dielectric 350 may be or include a High-K material. Dielectric 315 may be formed of aluminum oxide, hafnium oxide, tantalum silicon oxide, zirconium oxide, etc. In some cases, layer 350 is or includes $Al_2O_3$, $HfO_2$, $TaSiO_x$, $ZrO_2$, or a combination of these. Dielectric 350 may have a thickness of between 1 and 15 nanometers.

Gate structure 380 is shown formed on layer 350 in trench 305 over exposed surface 333. Structure 380 may include a metal gate. Gate structure 380 may be formed on a top surface of the AlGaN layer 350 by selectively etching the AlInN material to expose a top surface of the AlGaN material (e.g., surface 113 or 133, which may be below 113); and forming a gate dielectric 350 over the exposed surface of the AlGaN material (and sidewalls 313 and 315 and surface 143). Structure 380 may be formed over dielectric 350 in the trench and over the dielectric on portions 340 and 342 (e.g., in trench 305 and on portions of portions 340 and 342). Gate metals that might be used are Ti, Ni, Pt, TiN, W, Au, or combinations of these.

Junction 360 and 370 may extend through channel 314 and 315 respectively. Thus the junction regions may be in direct contact with channel 314 and 315 to reduce resistance of the transistor during operation. Junction region or source 360 is shown formed on surface 303 of layer 310 adjacent to portion 340, opposite (e.g., to the left of channel 314) of trench 305 (e.g., gate 380). Junction region or drain 370 is shown formed on surface 303 of layer 310 adjacent to portion 342, opposite (e.g., to the right of channel 315) of trench 305 (e.g., gate 380). Surface 303 may formed by thickness 31 of surface 113; and may be at or below channel 114. Region 360 may be an N+ GaN/InGaN source region. Region 370 may be an N+ GaN/InGaN drain region. Region 360 and 370 may have a thickness of between 10 and 200 nm.

FIG. 3 shows metal 362 on junction 360, and metal 372 on junction 370. Metal 362 and 372 can be used as a contact to the junction regions, as known in the art.

Figure 4:
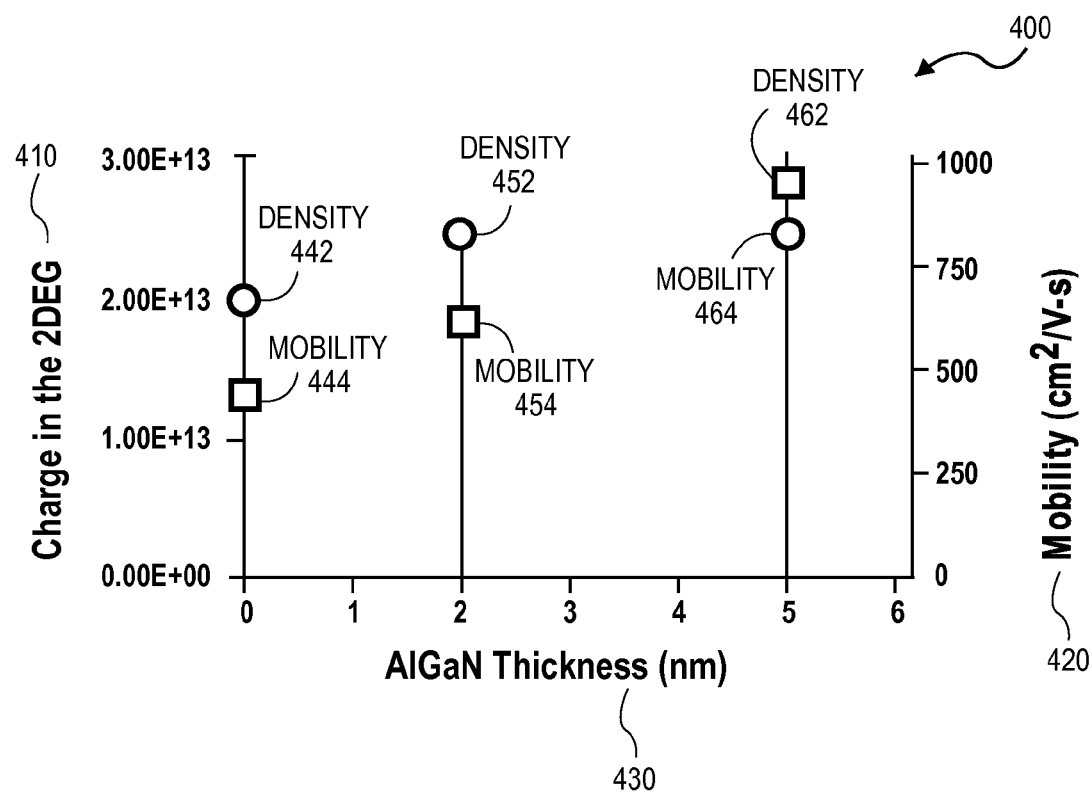
FIG. 4 shows a plot of mobility versus AlGaN thickness, and charge density versus thickness for Gallium Nitride (GaN) channel based transistor layers including an InAlN and AlGaN bi-layer capping stack on a GaN layer.

FIG. 4 shows a plot 400 of 2DEG channel carrier mobility 420 versus AlGaN capping layer thickness 430 (e.g., TH4), and 2DEG channel carrier charge density 410 versus thickness 430 for Gallium Nitride (GaN) channel based transistor layers (e.g., layers 100) including an InAlN and AlGaN bi-layer capping stack (e.g., stack 150) on a GaN layer (e.g., layer 110). The mobility and density may be for channel 114, but having stack 150 as noted below.

Plot 400 shows how the mobility and charge density change with insertion of the AlGaN layer 130 (e.g., as opposed to using only layer 140) to make the bi-layer stack. The mobility points refer to mobility and are measured on the right hand axis 420. The charge density points in the graph refer to the charge density of left hand axis 410. Thus, FIG. 4 shows a plot 400 of mobility 420 versus AlGaN thickness 430 on the right-hand axis, and charge density 410 versus thickness 430 on the left-hand axis.

FIG. 4 shows plotted point 442 as the plot of charge density 410 for an embodiment without layer 130 (e.g., without an AlGaN layer); and plotted point 444 as a plot of the mobility for that embodiment. Plot 400 shows plotted point 452 as the plot of charge density 410 for an embodiment with layer 130 (e.g., with an AlGaN layer) with a 2 nm thickness between an AlInN of 7 nm and an AlN layer of 1 nm; and plotted point 454 as a plot of the mobility for that embodiment. Plot 400 shows plotted point 462 as the plot of charge density 410 for an embodiment with layer 130 (e.g., with an AlGaN layer) with a 5 nm thickness between an AlInN of 7 nm and an AlN layer of 1 nm; and plotted point 464 as a plot of the mobility for that embodiment.

For the last bi-layer stack combination of 7 nm AlInN (83% Al and 17% In) and 5 nm AlGaN (30% Al) a mobility of 960 cm2/V–s (point 464) and charge density of 2.5E13 cm-2 (point 462) leads to the desired Rsh of ~250 ohms/sqr. It can be seen that with increasing thickness of the AlGaN layer (e.g., TH4) the mobility steadily improves for the bi-layer capping stack (e.g., stack 150, 351 or 750). For a single cap device stack of only AlInN, although the charge is very high (point 442) the mobility is around 450 cm2/v–s (point 444) resulting in Rsh of >500 ohms/sqr, which are not sufficient for SoC transistor targets. An Rsh of ~250 ohms/sqr may be the lowest observed Rsh GaN channel made on Si (100) substrates.

Figure 5:
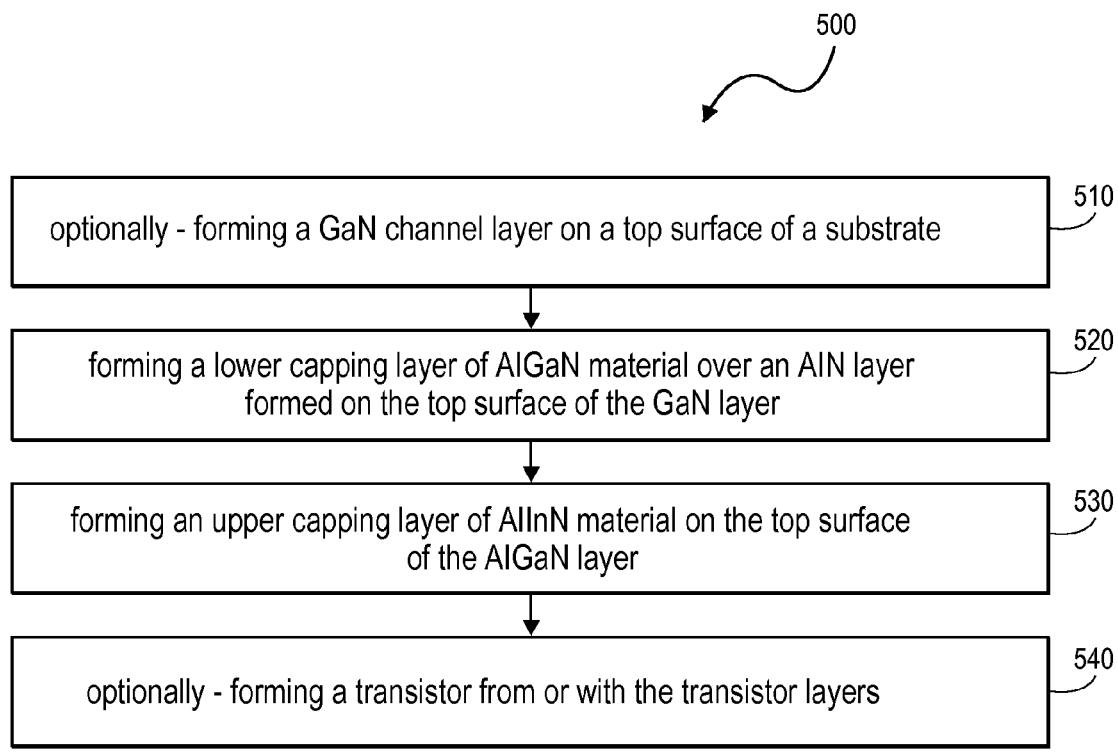
FIG. 5 is an example process for forming GaN channel based transistor layers including an InAlN and AlGaN bi-layer capping stack on a GaN layer.

FIG. 5 is an example process for forming GaN channel based transistor layers including an InAlN and AlGaN bi-layer capping stack on a GaN layer or channel. FIG. 5 may show process 500 for forming or forming a portion of layers 100, transistor 300, transistor 600 or transistor 700. In some cases process 500 is a process for forming a Low Sheet Resistance GaN Channel on Si Substrates Using InAlN and AlGaN bi-layer capping stack (e.g., see the "structure" of FIGS. 1, 3, 6-8) for inducing low Rsh channel. In some cases process 500 is a process for forming a flat, thin, or tri-gate transistor that is or is part of a voltage regulator, a power management integrated circuit (IC), a radio frequency (RF) power amplifier), or a system on a chip (SoC).

FIG. 5 shows process 500 beginning with block 510 where, in some optional cases, a GaN channel layer is formed on a top surface of a substrate. Block 510 may include forming the GaN layer comprises a GaN stack having a plurality of GaN layers separated by AlN layers, and an AlN layer between the top surface of the substrate and a bottom GaN layer. Block 510 may include descriptions above with respect to layer 110, 310, 610 or 710.

Next, at block 520, a first, lower or bottom capping layer that is or includes an AlGaN material is formed on or over the top surface of the GaN layer. Block 520 may include forming a layer of AlN material between a top surface of the GaN layer and a bottom surface of the AlGaN layer. Block 520 may include descriptions above with respect to layer 120, 130 or 730. In some cases, the AlGaN layer has a thickness of between 2 and 10 nm, and an electron density of greater than 2.5 E13 cm/2. In some cases, the AlGaN layer comprises $Al_xGa_{(1-x)}N$, where X is less than 0.4 (or X is between 0.35 and 0.4). In some cases, block 520 include descriptions above with respect to layer 130 or 730.

Next, at block 530, a second, upper or top capping layer (e.g., with respect to the bottom capping layer) that is or includes an AlInN material is formed on or over the top surface of the AlGaN layer. In some cases, the AlInN layer has a thickness of between 5 and 15 nm, and a channel mobility of between 900 and 1000 CM2. In some cases, the AlInN layer is $Al_YIn_{(1-Y)}N$, where Y is less than 0.2 (or is equal to 0.17). In some cases, a top surface of the AlGaN material forms a setback material surface upon which the AlInN material may be selectively etched. Block 520 may include descriptions above with respect to layer 140 or 740.

In some cases blocks 520 and 530 may describe forming a bi-layer capping stack on or over a top surface of the GaN layer, wherein the bi-layer capping stack, has a sheet resistance of less than or equal to 250 ohms per SQR; or between 250 and 350 ohms per SQR across the width of the 2DEG channel. In some cases, the AlGaN layer causes electrons in a channel of the GaN material to be subject to less interface roughness scattering and less alloy scattering, and thus provide a higher mobility than without the AlGaN layer.

In some cases, block 510 includes forming the GaN layer in a chamber at a temperature of approximately 1050 degrees Celsius (C); block 520 includes forming the AlGaN layer a chamber at a temperature of between 1000 and 1050 degrees C.; and block 530 includes forming the AlInN layer in a chamber at a temperature between 700 and 750 degrees C. In some cases, a top and bottom surface of the GaN, AlGaN, and AlInN layers include smooth surfaces. In some cases, blocks 510, 520 and 530 describe forming transistor layers for a GaN channel transistor.

Next, at block 540, in some optional cases, a transistor is formed from the transistor layers. Block 540 may include forming a gate on or over (e.g., on a dielectric layer formed on a top surface of the AlGaN layer. In some cases, forming the gate includes selectively etching the AlInN material to expose a top surface of the AlGaN material; and forming a gate dielectric over the exposed surface of the AlGaN material. Selectively etching the AlInN material may be by using a wet etch including a KOH or a NH4OH solution to selectively etch the AlInN material with the exception of (e.g., but not etch) the AlGaN material. Block 540 may include descriptions above with respect to trench 305, layer 350, gate 380 or region 780.

Block 540 may optionally include forming junction regions (e.g., source and drain) on or over the AlInN layer. In some cases, the threshold voltage for activating or turning on the transistor (Vt) is greater than 0 volts.

According to embodiments, process 500 only includes blocks 520 and 530. According to embodiments, process 500 only includes blocks 510, 520 and 530. According to embodiments, process 500 only includes blocks 520, 530 and 540.

According to embodiments, the descriptions above for FIG. 1-5 can be applied to other types of transistors such as a tri-gate transistor, or transistors having a GaN channel formed by other processes.

According to some embodiments, the bi-layer capping stack 150 is used instead of growing AlInN 140 directly on the GaN buffer 110 on Si (100) substrate 101. This avoids the non-uniformity of the AlInN layer (especially close to the GaN channel) which could be responsible for low mobility observed in the GaN channel, without layer 130. By inserting a uniform AlGaN layer 130 (and optionally, layer 120) before the AlInN layer 140, the electrons in the channel 114 are subject to less interface roughness scattering and alloy scattering, and a high mobility is obtained.

In some cases, the AlGaN layer 130 is kept thin, as high Al composition AlGaN (e.g., 35-40% Al) has a critical layer thickness of ~8-10 nm on GaN before it starts to create dislocations and defects in the GaN. Also the AlGaN layer has to be uniform and high quality so as to maintain the high channel mobility. Some embodiments also include layer 120 to further smoothen or homogenize the percentage of Al at surface 113, thus reducing alloy scattering. In some cases, the AlInNl AlGaN bi-layer stack includes very smooth surface morphology of the bi-layer stack, again highlighting the benefit of the AlGaN layer in obtaining a smooth final epi-surface. In some cases, the embodiments herein are related to fabrication of type III-V and Si substrate or channel devices that are produced for use in personal computers, tablet computers, smartphone, power management and communication devices.

FIG. 6 is a schematic cross section view of a portion of a semiconductor substrate base 101 after forming a Gallium Nitride (GaN) channel based transistor 600 having a GaN layer 610 grown out of trenches or gaps in the Silicon substrate (e.g., see portions 614, 616 and 618 of GaN); and an InAlN and AlGaN bi-layer capping stack (e.g., stack 351 with trench 305) on the GaN layer. For transistor 600, stack 351 includes trench 305 etched or disposed through layer 140 and to layer 130. Consequently, transistor 600 includes layer 610 having 2DEG channels 314 and 315 adjacent to channel 316 below gate 380.

Layer 610 is shown having thickness TH2 and thickness TH21 of oxide regions 612, 615, 617 and 619 on surface 103. Between the oxide regions material 610 has GaN regions 614, 616, and 618. The oxide regions have width W4, such as a width between 50 and 1000 nanometers. Regions 614, 616 and 618 have width W3, such as a width between 20 and 1000 nanometers. Thickness TH21 may be between 20 and 200 nanometers. In some cases, the thickness, spacing and width of the oxide (e.g., regions 612, 615, 617 and 619) will be determined by the dimensions of the GaN Transistor 600. Layer 610 may represent a trench growth of GaN material between the oxide regions, such as where region 614, 616, and 618 are grown from surface 103 between the oxide regions (e.g., see descriptions of FIG. 2 for the 3D islands or nanowires and 2D layer of layer 220). Such growth may extend above surface 113 and then be planarized (e.g., the 2D layer) to form surface 113. Transistor 600 may have a GaN channel grown out of Trenches to form a planar GaN transistor using Bi-layer composite stack 150.

Figure 7:
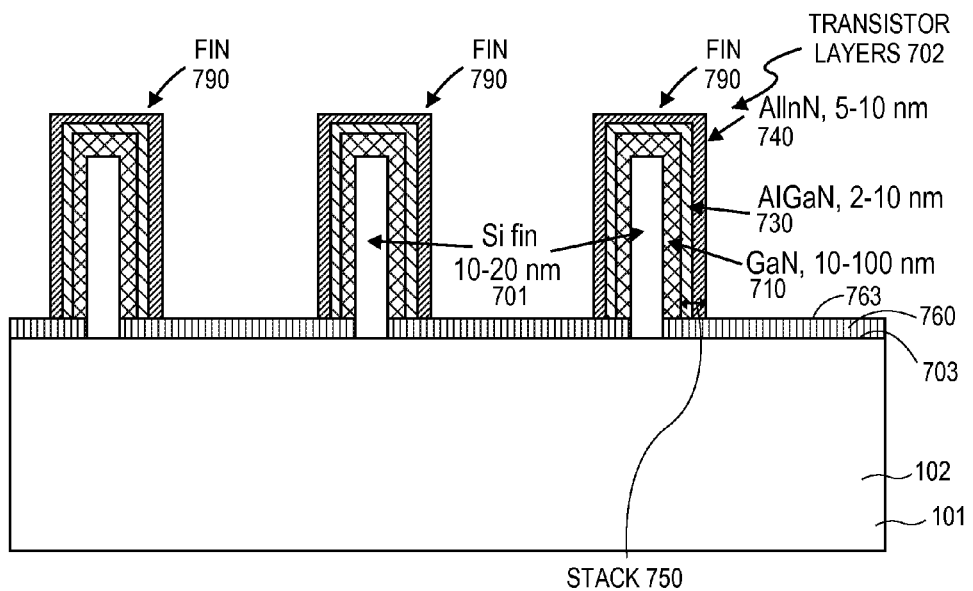
FIG. 7 is a schematic cross section view of a portion of a semiconductor substrate base after forming a Gallium Nitride (GaN) channel based fin transistor having a GaN fin layer grown on a Silicon fin; and an InAlN and AlGaN bi-Layer fin Capping Stack on a GaN fin layer.
Figure 8:
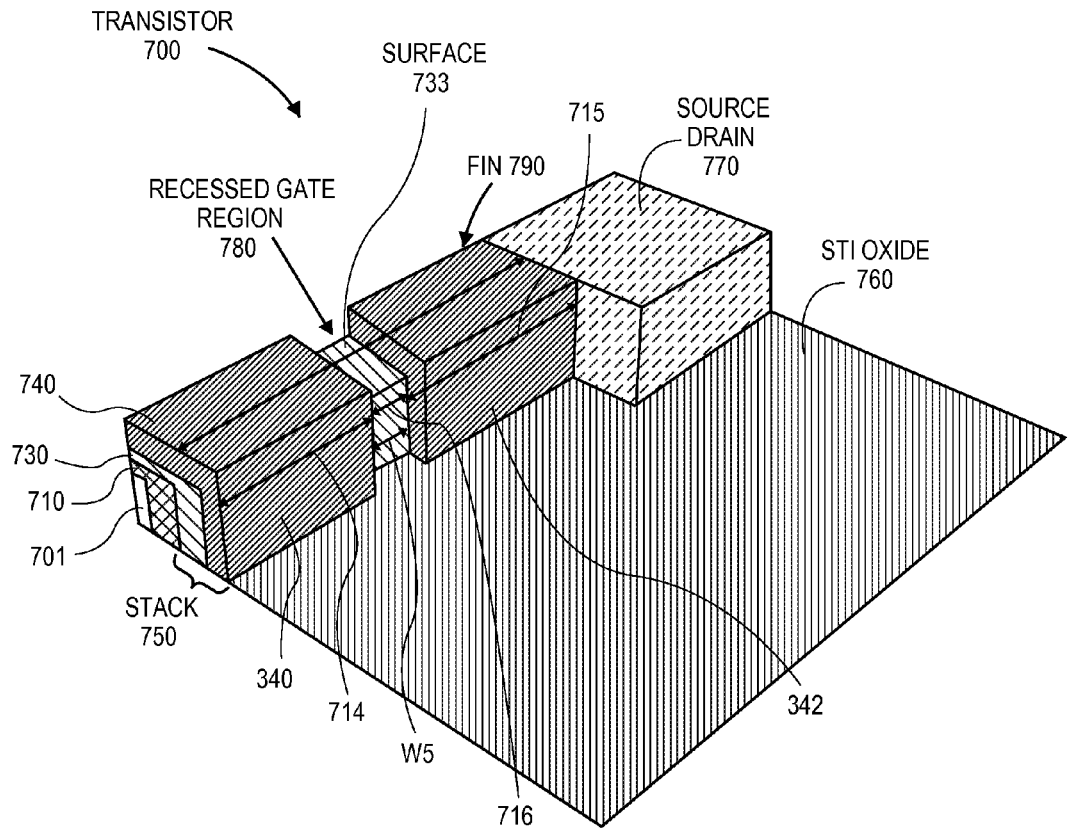
FIG. 8 is a 3-dimensional (3D) cross section along the fin 790 of a portion of a semiconductor substrate base after forming a Gallium Nitride (GaN) channel based fin transistor from layer having a GaN fin layer grown on a Silicon fin; and an InAlN and AlGaN bi-Layer fin Capping Stack on the GaN fin layer.

FIG. 7 is a schematic cross section view of a portion of a semiconductor substrate base 101 after forming Gallium Nitride (GaN) channel based fin transistor layers 702 having a GaN fin layer 710 grown on a Silicon fin 701; and an InAlN and AlGaN bi-Layer fin Capping Stack (e.g., fin stack 750 with recessed gate region 780) on the GaN fin layer. FIG. 8 is a 3D cross section along the fin 790 of a portion of a semiconductor substrate base 101 after forming a Gallium Nitride (GaN) channel based fin transistor 700 from fin transistor layers 702 having a GaN fin layer 710 grown on a Silicon fin 701, and an InAlN and AlGaN bi-Layer fin Capping Stack (e.g., fin stack 750 with recessed gate region 780) on the GaN fin layer. FIG. 8 may show a perspective cross-section view along the fin of the GaN channel based fin transistor of FIG. 7. Transistor 700 may be a Trigate version of transistor 300, using the Bi-layer Composite Stack 750.

FIG. 7 shows fins 790 including fin transistor layers 702 having InAlN and AlGaN bi-layer capping stacks 750, formed on fins 701. In some cases, transistor layers 702 may be for function similar to layer 100, but be formed in a "fin" shape such as for a fin transistor. Stack 750 may be similar to stack 351, but be formed in a "fin" shape such as for a fin transistor. For fin transistor layers 702, stack 750 includes recessed gate region 780 having width W5 etched or disposed through layer 140 and to layer 130 around 3 sides of fin 790. Consequently, fin transistor layers 702 include layer 710 having 2DEG channels 714 and 715 (e.g., similar to channels 314 and 315 but around 3 sides of fin 790); and adjacent to channel 716 (e.g., similar to channel 316 but around 3 sides of fin 790) below recessed gate region 780. Channel 716 may exclude a 2DEG channel because layer 740 does not exist above channel 716.

Fins 790 (or fin transistor layers 702) may include fins 701, layers 710, layer 730, and layer 740 formed around 3 sides of fin 790. Fins 701 may be formed on surface 703 of substrates 101. In some cases, fins 701 are formed by etching surface 103 of substrate 101. Fins 701 may be silicon fins, having a thickness of between 10 and 20 nanometers. Layer 710 may be grown on (e.g., epitaxially) or deposited on surfaces of fin 701. Fin 701 may include material 102 and may have surfaces similar to surfaces 103. Material 710 may be formed of material described for layer 110. In some case, material 710 includes 1 or more layers described for layer 110 (e.g., see FIG. 2). Layer 730 is formed on or over layer 710. In some cases, an AlN fin layer such a layer similar to layer 120 formed around 3 sides of fin 790, is formed between layer 730 and layer 710. This AlN layer may have a thickness similar to that of layer 120.

FIGS. 7 and 8 show shallow trench isolation (STI) oxide 760 formed on surface 703 of substrate 101. Layer 760 may have top surface 763 upon which layer 710, 730 and 740 touch or are disposed above.

Layer 730 may be of similar material, formed by a similar process and have a similar function as that of layer 130. Layer 740 is shown formed on layer 730. Layer 740 may be of similar material, formed by a similar process and have a similar function as that of layer 140.

Layer 710 may be a layer of GaN having a thickness of between 10 and 100 nanometers. Layer 730 may be a layer of AlGaN material having a thickness of between 2 and 10 nanometers. Layer 740 may be a layer of AlInN having a thickness of between 5 and 10 nanometers.

FIG. 8 shows transistor 700 including fin transistor layers 702 (e.g., fin 790) and recessed gate region 780. Recessed gate region 780 may be a region where layer 740 is etched away to expose surface 733 or layer 730. A gate may be formed on region 780, such as to form a thin transistor.

FIG. 8 shows junction region 770, such as a source or drain region. It can be appreciated that another junction region may be formed on the other end of transistor 700.

In some cases, bi-layer capping stack 750 causes or induces a sheet resistance of less than or equal to 250 ohms per SQR in the combination of the 2DEG channels 714 and 715 (e.g., excluding channel 716). In some cases this resistance may be across W6, between left and right ends of the channel of the combination of channels 714 and 715 (excluding channel 716). In some cases, bi-layer capping stack 751 causes or induces a sheet resistance of between 200 and 300 ohms per SQR in the combination channel.

Thus, the devices and processes described herein provide higher channel mobility, charge density and lower sheet resistance for a GaN channel device (e.g., having a 2DEG channel or channel portions). In some cases, layers 100, transistor 300, transistor 600 or transistor 700 may be or be part of a voltage regulator, a power management integrated circuit (IC), a radio frequency (RF) power amplifier, or a system on a chip (SoC). In some cases, such an SoC may be or include FIG. 9, and may include transistors for power delivery, in contact with a battery, providing power to circuitry of a system on a chip, or of a SoC. A SoC may have battery power management (e.g. power on, power off, and power voltage source transistors) on the same chip with logic transistors, memory transistors, communications transistors (e.g. RF amplifiers), and/or other electronics and logic.

It may be desirable for such transistors to have very low resistance between junction regions so that power is not lost or required for the transistors to deliver power to the circuitry, from the battery. In some cases, using transistor layers 100, transistor 300, 600, or 700 having stack 150, provides low sheet resistance, as noted herein, for such transistors.

Figure 9:
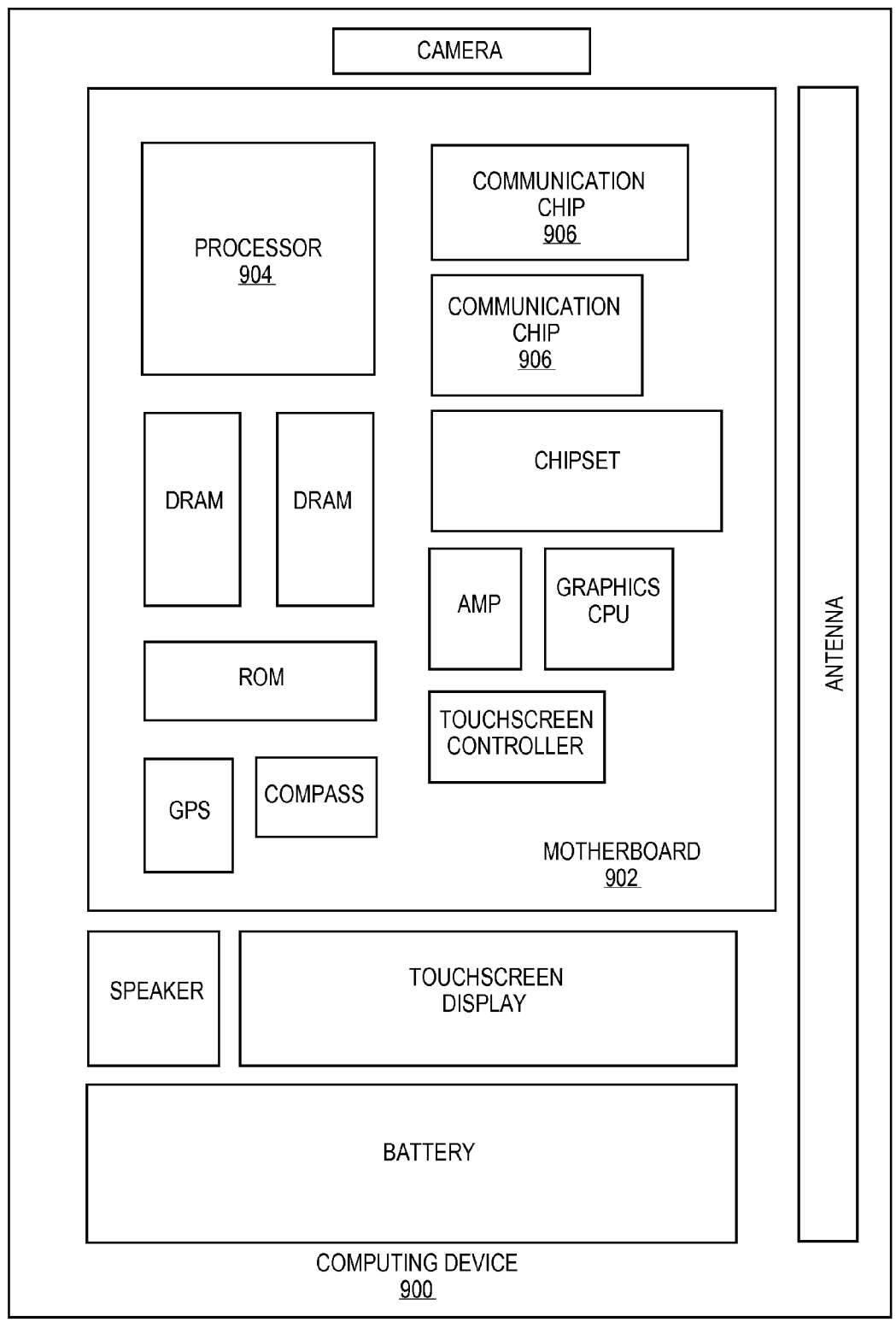
FIG. 9 illustrates a computing device, such as a system on a chip (SoC), in accordance with one implementation.

FIG. 9 illustrates a computing device 900, such as a system on a chip (SoC), in accordance with some implementations. The computing device 900 houses board 902. Board 902 may include a number of components, including but not limited to processor 904 and at least one communication chip 906. Processor 904 is physically and electrically connected to board 902. In some implementations at least one communication chip 906 is also physically and electrically connected to board 902. In further implementations, communication chip 906 is part of processor 904.

In some cases, FIG. 9 illustrates a computing device 900 including a system on a chip (SoC) 902, in accordance with one implementation. In some cases, FIG. 9 shows an example of a Systems on a chip (SoC) technology (e.g., motherboard 902). Such a SoC may include a microprocessor or CPU, as well as various other components, including electronics and transistors for power and battery regulation; radio frequency (RF) processing, receipt and transmission; voltage regulation; power management; and possibly other systems such as those that may be found in a cellular telephone, etc. FIG. 9 may include one or more of transistor layers 100, transistor 300, 600, or 700 having stack 150, thus providing low sheet resistance, as noted herein.

Depending on its applications, computing device 900 may include other components that may or may not be physically and electrically connected to board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 906 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

Processor 904 of computing device 900 includes an integrated circuit die packaged within processor 904. In some implementations, the integrated circuit die includes one or more of transistor layers 100, transistor 300, transistor 600, and/or transistor 700 having stack 150, thus providing low sheet resistance, as noted herein, such as with reference to FIGS. 1-8. The term "processor" may refer to any device or portion of a device that processes electronic data from registers and/or memory to transform that electronic data into other electronic data that may be stored in registers and/or memory. In some cases, processor 904 may be a SoC.

Communication chip 906 also includes an integrated circuit die packaged within communication chip 906. In accordance with another implementation, a package including a communication chip incorporates one or more of transistor layers 100, transistor 300, transistor 600, and/or transistor 700 having stack 150, thus providing low sheet resistance, as noted herein. In further implementations, another component housed within computing device 900 may contain a microelectronic package including a fin device having cladding device layers such as described above.

In various implementations, computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 900 may be any other electronic device that processes data.

EXAMPLES

The following examples pertain to embodiments.

Example 1 is a method to form transistor layers comprising: forming a GaN channel layer on a top surface of a substrate; forming a bi-layer capping stack on a top surface of the GaN layer, wherein forming the bi-layer capping stack includes: forming a lower capping layer of AlGaN material on a top surface of an AlN layer formed on the top surface of the GaN layer; and forming an upper capping layer of AlInN material on a top surface of the AlGaN material.

In Example 2, the subject matter of Example 1 can optionally include, wherein the GaN layer comprises a GaN stack having a plurality of GaN layers separated by AlN layers, and wherein the bi-layer capping stack causes a sheet resistance of between 200 and 300 ohms per SQR in a 2DEG channel formed in a upper thickness of the GaN layer.

In Example 3, the subject matter of Example 1 can optionally include, wherein the AlGaN layer has a thickness of between 2 and 10 nm, and an electron density of greater than 2.5 E13 cm/2; and wherein the AlInN layer has a thickness of between 5 and 15 nm, and a channel mobility of between 900 and 1000 CM2.

In Example 4, the subject matter of Example 1 can optionally include, wherein the AlGaN layer comprises $Al_XGa_{(1-X)}N$, where X is less than 0.4; and wherein the AlInN layer is $Al_YIn_{(1-Y)}N$, where Y is greater than 0.8.

In Example 5, the subject matter of Example 1 can optionally include, wherein a top surface of the AlGaN material forms a setback material surface upon which the AlInN material may be selectively etched.

In Example 6, the subject matter of Example 1 can optionally further be comprising: forming a gate over a top surface of the AlGaN layer; and forming junction regions on the AlInN layer on either side of the gate.

In Example 7, the subject matter of Example 6 can optionally include, wherein forming the gate comprises: selectively etching the AlInN material to expose a top surface of the AlGaN material, wherein selectively etching the AlInN material comprises using a wet etch including a KOH or a NH4OH solution to selectively etch the AlInN material but not etch the AlGaN material; forming a gate dielectric over the exposed surface of the AlGaN material; and forming a metal gate electrode on the gate dielectric.

In Example 8, the subject matter of Example 1 can optionally include, wherein the AlGaN layer has a predetermined thickness configured to cause electrons in a 2DEG channel of the GaN material to be subject to less interface roughness scattering and less alloy scattering, and thus provide a higher mobility than without the AlGaN layer.

In Example 9, the subject matter of Example 1 can optionally include, wherein forming the GaN layer comprises forming the GaN material in a chamber at a temperature of approximately 1050 degrees Celsius (C); wherein forming the AlGaN layer comprises forming AlGaN in a chamber at a temperature of between 1000 and 1050 degrees C.; and wherein forming the AlInN layer comprises forming AlInN material in a chamber at a temperature between 700 and 750 degrees C.

In Example 10, the subject matter of Example 1 can optionally include, wherein the transistor is part of one of a voltage regulator, a power management integrated circuit (IC), a radio frequency (RF) power amplifier, or a system on a chip (SoC).

Example 11 is transistor layers comprising: a GaN channel layer on a top surface of a substrate; a bi-layer capping stack on a top surface of the GaN layer, wherein the bi-layer capping stack includes: a lower capping layer of AlGaN material on a top surface of an AlN layer on the top surface of the GaN layer; and an upper capping layer of AlInN material on a top surface of the AlGaN material.

In Example 12, the subject matter of Example 11 can optionally include, wherein the GaN layer comprises a GaN stack having a plurality of GaN layers separated by AlN layers, and wherein the bi-layer capping stack causes a sheet resistance of between 200 and 300 ohms per SQR in a 2DEG channel formed in a upper thickness of the GaN layer.

In Example 13, the subject matter of Example 11 can optionally include, wherein the AlGaN layer has a thickness of between 2 and 10 nm, and an electron density of greater than 2.5 E13 cm/2; and wherein the AlInN layer has a thickness of between 5 and 30 nm, and a channel mobility of between 900 and 1400 CM2/V−s.

In Example 14, the subject matter of Example 11 can optionally include, wherein the AlGaN layer comprises $Al_XGa_{(1-X)}N$, where X is less than 0.4; and wherein the AlInN layer is $Al_YIn_{(1-Y)}N$, where Y is greater than 0.8.

In Example 15, the subject matter of Example 11 can optionally include, wherein a top surface of the AlGaN material forms a setback material surface upon which the AlInN material may be selectively etched.

In Example 16, the subject matter of Example 11 can optionally further be comprising: a gate over a top surface of the AlGaN layer; and junction regions on the AlInN layer on either side of the gate.

In Example 17, the subject matter of Example 16 can optionally include, wherein the gate comprises: a gate dielectric over an exposed surface of the AlGaN material in a trench; and a metal gate electrode on the gate dielectric in the trench.

In Example 18, the subject matter of Example 11 can optionally include, wherein the AlGaN layer has a predetermined thickness configured to cause electrons in a 2DEG channel of the GaN material to be subject to less interface roughness scattering and less alloy scattering, and thus provide a higher mobility than without the AlGaN layer.

In Example 19, the subject matter of Example 11 can optionally include, wherein the transistor is part of one of a voltage regulator, a power management integrated circuit (IC), a radio frequency (RF) power amplifier, or a system on a chip (SoC).

Example 20 is a system for computing comprising: a microprocessor coupled to a memory, the microprocessor having at least one electronic transistor having transistor layers comprising: a GaN channel layer on a top surface of a substrate; a bi-layer capping stack on a top surface of the GaN layer, wherein the bi-layer capping stack includes: a lower capping layer of AlGaN material on a top surface of an AlN layer on the top surface of the GaN layer; and an upper capping layer of AlInN material on a top surface of the AlGaN material.

In Example 21, the subject matter of Example 20 can optionally include, wherein the AlGaN layer has a thickness of between 2 and 10 nm, and an electron density of greater than 2.5 E13 cm/2; and wherein the AlInN layer has a thickness of between 5 and 15 nm, and a channel mobility of between 900 and 1400 CM2/V–s, and wherein the bi-layer capping stack causes a sheet resistance of between 200 and 300 ohms per SQR in a 2DEG channel formed in a upper thickness of the GaN layer.

In Example 22, the subject matter of Example 20 can optionally include, wherein the AlGaN layer comprises $Al_xGa_{(1-x)}N$, where X is less than 0.4; and wherein the AlInN layer is $Al_yIn_{(1-y)}N$, where Y is greater than 0.8.

In Example 23, the subject matter of Example 20 can optionally be further comprising: a gate over a top surface of the AlGaN layer, wherein the gate comprises: a gate dielectric over an exposed surface of the AlGaN material in a trench; and a metal gate electrode on the gate dielectric in the trench; and junction regions on the AlInN layer on either side of the gate.

In Example 24, the subject matter of Example 20 can optionally include, wherein the transistor is part of one of a voltage regulator, a power management integrated circuit (IC), a radio frequency (RF) power amplifier, or a system on a chip (SoC).

Example 25 is an apparatus comprising means for performing the method of any one of claims 1-10.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects of embodiments. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe forming planar or fin transistor layers or transistors, the descriptions and figures above can be applied to forming other transistor configurations including, for example, dual-gate, all around gate (AAG) (also referred to as gate all around), wire (e.g., nanowire), and other suitable transistor configurations. Thus, the claims following the Detailed Description are hereby expressly incorporated into this Detailed Description, with each claim standing on its own as a separate embodiment of the invention.

What is claimed is:

1. A method to form transistor layers comprising:
   forming a GaN channel layer comprising (1) GaN material on a top surface of a substrate (2) a capping AlN layer that has a thickness of between 0.6 and 1.5 nanometers on the GaN material, wherein the GaN channel layer includes islands of GaN material formed between islands that consist of oxide material only that are completely buried under a thickness of the GaN material;
   forming a bi-layer capping stack on a top surface of the GaN channel layer, wherein forming the bi-layer capping stack includes:
     forming a lower capping AlGaN layer of AlGaN material on a top surface of a capping AlN layer comprising AlN material and excluding Indium formed on the top surface of the GaN channel layer; and
     forming an upper capping AlInN layer of AlInN material on a top surface of the AlGaN material, wherein the AlGaN layer comprises $Al_xGa_{(1-x)}N$, where X is less than 0.4; and wherein the AlInN layer is $Al_yIn_{(1-y)}N$, where Y is greater than 0.8, wherein a top surface of the AlGaN material forms a setback material surface upon which the AlInN material may be selectively etched, wherein the AlGaN layer has a thickness of between 2 and 10 nm, and causes an electron density of greater than 2.5 E13 cm/2; and wherein the AlInN layer has a thickness of between 5 and 15 nm, and causes a channel mobility of between 900 and 1000 CM2/V-s, wherein the bi-layer capping stack causes a sheet resistance of between 200 and 300 ohms per SQR in a 2DEG channel formed in a upper thickness of the GaN layer.

2. The method of claim 1, further comprising:
   forming a gate over a top surface of the AlGaN layer; and
   forming junction regions on the AlInN layer on either side of the gate.

3. The method of claim 2, wherein forming the gate comprises:
selectively etching the AlInN material to expose a top surface of the AlGaN material, wherein selectively etching the AlInN material comprises using a wet etch including a KOH or a NH4OH solution to selectively etch the AlInN material but not etch the AlGaN material;
forming a gate dielectric over all of the exposed surface of the AlGaN material; and
forming a metal gate electrode on the gate dielectric.

4. The method of claim 1, wherein the AlGaN layer has a predetermined thickness configured to cause electrons in a 2DEG channel of the GaN material of the GaN channel layer to be subject to less interface roughness scattering and less alloy scattering, and thus provide a higher mobility than without the AlGaN layer.

5. The method of claim 1, wherein forming the GaN channel layer comprises forming the GaN material in a chamber at a temperature of approximately 1050 degrees Celsius (C); wherein forming the AlGaN layer comprises forming AlGaN in a chamber at a temperature of between 1000 and 1050 degrees C.; and wherein forming the AlInN layer comprises forming AlInN material in a chamber at a temperature between 700 and 750 degrees C.

6. The method of claim 1, wherein the AlGaN material is formed on and touching a top surface of AlN material of the capping AlN layer, wherein the AN material excludes AlInN, and wherein the AlInN material is formed on and touching a top surface of the AlGaN material.

7. The method of claim 1, wherein the islands of GaN material have a width or diameter of between 50 and 250 nm, and have a thickness of between 50 and 250 nm.

8. The method of claim 1, wherein the top surface of the substrate includes a plurality of substrate fins having three sides of substrate material; wherein the GaN channel layer is formed on the three sides of the substrate material; wherein the top surface of the GaN channel layer includes three sides of GaN material; and wherein the bi-layer capping stack is formed on the three sides of the GaN material.

9. A method of claim 1, wherein the AlGaN layer has a thickness of 2 or 5 nanometers, the AlInN layer has a thickness of 7 nanometers, and the MN layer has a thickness of 1 nanometer.

10. Transistor layers comprising:
a GaN channel layer comprising (1) GaN material on a top surface of a substrate, (2) a capping AlN layer that has a thickness of between 0.6 and 1.5 nanometers on the GaN material, wherein the GaN channel layer includes islands of GaN material formed between islands that consist of oxide material only that are completely buried under a thickness of the GaN material;
a bi-layer capping stack on a top surface of the GaN channel layer, wherein the bi-layer capping stack includes:
a lower capping AlGaN layer of AlGaN material on a top surface of a capping AlN layer comprising AlN material and excluding Indium on the top surface of the GaN channel layer; and
an upper capping AlInN layer of AlInN material on a top surface of the AlGaN material, wherein the AlGaN layer comprises $Al_XGa_{(1-X)}N$, where X is less than 0.4; and wherein the AlInN layer is $Al_YIn_{(1-Y)}N$, where Y is greater than 0.8, wherein a top surface of the AlGaN material forms a setback material surface upon which the AlInN material may be selectively etched, wherein the AlGaN layer has a thickness of between 2 and 10 nm, and causes an electron density of greater than 2.5 E13 cm/2; and wherein the AlInN layer has a thickness of between 5 and 30 nm, and causes a channel mobility of between 900 and 1400 CM2/V-s, wherein the bi-layer capping stack causes a sheet resistance of between 200 and 300 ohms per SQR in a 2DEG channel formed in a upper thickness of the GaN layer.

11. The transistor layers of claim 10, further comprising:
a gate over a top surface of the AlGaN layer; and
junction regions on the AlInN layer on either side of the gate.

12. The transistor layers of claim 11, wherein the gate comprises:
a gate dielectric over all of an exposed surface of the AlGaN material in a trench; and
a metal gate electrode on the gate dielectric in the trench.

13. The transistor layers of claim 10, wherein the AlGaN layer has a predetermined thickness configured to cause electrons in a 2DEG channel of the GaN material of the GaN channel layer to be subject to less interface roughness scattering and less alloy scattering, and thus provide a higher mobility than without the AlGaN layer.

14. The transistor of claim 10, wherein the AlGaN material is formed on and touching a top surface of AlN material of the capping AlN layer, wherein the AlN material excludes AlInN, and wherein the AlInN material is formed on and touching a top surface of the AlGaN material.

15. The transistor of claim 10, wherein the islands of GaN material have a width or diameter of between 50 and 250 nm, and have a thickness of between 50 and 250 nm.

16. The transistor of claim 10, wherein the top surface of the substrate includes a plurality of substrate fins having three sides of substrate material; wherein the GaN channel layer is formed on the three sides of the substrate material; wherein the top surface of the GaN channel layer includes three sides of GaN material; and wherein the bi-layer capping stack is formed on the three sides of the GaN material.

17. The transistor of claim 10, wherein the AlGaN layer has a thickness of 2 or 5 nanometers, the AlInN layer has a thickness of 7 nanometers, and the AlN layer has a thickness of 1 nanometer.

18. A system for computing comprising:
a microprocessor coupled to a memory, the microprocessor having at least one electronic transistor having transistor layers comprising:
a GaN channel layer comprising (1) GaN material on a top surface of a substrate (2) a capping AlN layer that has a thickness of between 0.6 and 1.5 nanometers on the GaN material, wherein the GaN channel layer includes islands of GaN material formed between islands that consist of oxide material only that are completely buried under a thickness of the GaN material;
a bi-layer capping stack on a top surface of the GaN channel layer, wherein the bi-layer capping stack includes:
a lower capping AlGaN layer of AlGaN material on a top surface of a capping AlN layer comprising AlN material and excluding Indium on the top surface of the GaN channel layer; and
an upper capping AlInN layer of AlInN material on a top surface of the AlGaN material, wherein the AlGaN layer comprises $Al_XGa_{(1-X)}N$, where X is less than 0.4; and wherein the AlInN layer is $Al_YIn_{(1-Y)}N$, where Y is greater than 0.8, wherein a top surface of the AlGaN material forms a setback material surface upon which the AlInN material may be selectively etched, wherein the AlGaN layer has a thickness of between 2 and 10 nm, and causes an electron density of greater than 2.5 E13 cm/2; and wherein the AlInN layer has a thickness of between 5 and 15 nm, and causes a channel mobility of between 900 and 1400 CM2/V-s, wherein the bi-layer capping stack causes a sheet resistance of between 200 and 300 ohms per SQR in a 2DEG channel formed in a upper thickness of the GaN layer.

19. The system of claim 18, further comprising:
a gate over a top surface of the AlGaN layer, wherein the gate comprises:
  a gate dielectric over all of an exposed surface of the AlGaN material in a trench; and
  a metal gate electrode on the gate dielectric in the trench; and
junction regions on the AlInN layer on either side of the gate.

20. The system of claim 18, wherein the AlGaN material is formed on and touching a top surface of AlN material of the capping AlN layer, wherein the AlN material excludes AlInN, and wherein the AlInN material is formed on and touching a top surface of the AlGaN material.

21. The system of claim 18, wherein the islands of GaN material have a width or diameter of between 50 and 250 nm, and have a thickness of between 50 and 250 nm.

22. The system of claim 18, wherein the top surface of the substrate includes a plurality of substrate fins having three sides of substrate material; wherein the GaN channel layer is formed on the three sides of the substrate material; wherein the top surface of the GaN channel layer includes three sides of GaN material; and wherein the bi-layer capping stack is formed on the three sides of the GaN material.

23. The system of claim 18, wherein the AlGaN layer has a thickness of 2 or 5 nanometers, the AlInN layer has a thickness of 7 nanometers, and the AlN layer has a thickness of 1 nanometer.

24. A method to form transistor layers comprising:
forming a GaN channel layer comprising (1) GaN material on a top surface of a substrate and (2) a capping AlN layer that has a thickness of between 0.6 and 1.5 nanometers on the GaN material, wherein the GaN channel layer includes islands of GaN material formed between islands that consist of oxide material only that are completely buried under a thickness of the GaN material;
forming a bi-layer capping stack on a top surface of the GaN channel layer, wherein forming the bi-layer capping stack includes:
  forming a lower capping AlGaN layer of AlGaN material on a top surface of a capping AlN layer comprising AlN material and excluding Indium formed on the top surface of the GaN channel layer;
  forming an upper capping AlInN layer of AlInN material on a top surface of the AlGaN material, wherein the AlGaN layer has a thickness of between 2 and 10 nm, and causes an electron density of greater than 2.5 E13 cm/2; and wherein the AlInN layer has a thickness of between 5 and 15 nm, and causes a channel mobility of between 900 and 1000 CM2/V-s, wherein the bi-layer capping stack causes a sheet resistance of between 200 and 300 ohms per SQR in a 2DEG channel formed in a upper thickness of the GaN layer;
selectively etching the AlInN material to expose a top surface of the AlGaN material, wherein selectively etching the AlInN material comprises using a wet etch including a solution to selectively etch the AlInN material but not etch the AlGaN material;
forming a gate dielectric over all of the exposed surface of the AlGaN material; and
forming a metal gate electrode on the gate dielectric.

25. A method of claim 24, wherein the AlGaN layer has a predetermined thickness configured to cause electrons in a 2DEG channel of the GaN material of the GaN channel layer to be subject to less interface roughness scattering and less alloy scattering, and thus provide a higher mobility than without the AlGaN layer.

26. A method of claim 24, wherein forming the GaN channel layer comprises forming the GaN material in a chamber at a temperature of approximately 1050 degrees Celsius (C); wherein forming the AlGaN layer comprises forming AlGaN in a chamber at a temperature of between 1000 and 1050 degrees C.; and wherein forming the AlInN layer comprises forming AlInN material in a chamber at a temperature between 700 and 750 degrees C.

* * * * *